United States Patent [19]

Nakagawa

[11] 4,223,524
[45] Sep. 23, 1980

[54] QUARTZ OSCILLATION CIRCUIT FOR ELECTRONIC TIMEPIECES

[75] Inventor: Hisahide Nakagawa, Tachikawa, Japan

[73] Assignee: Citizen Watch Co., Ltd., Japan

[21] Appl. No.: 21,114

[22] Filed: Mar. 16, 1979

[30] Foreign Application Priority Data

Mar. 17, 1978 [JP] Japan ................................. 53-30620
Feb. 15, 1979 [JP] Japan ................................. 54-16564

[51] Int. Cl.² .......................... G04C 3/00; H03L 1/00
[52] U.S. Cl. .................................... 368/156; 310/315; 331/176
[58] Field of Search ............ 58/23 AC; 310/311, 314, 310/315, 317, 318; 331/116 R, 176

[56] References Cited

U.S. PATENT DOCUMENTS 3,676,801  7/1972  Musa .................................. 58/23 A

FOREIGN PATENT DOCUMENTS 1135179  12/1968  United Kingdom ..................... 331/116

*Primary Examiner*—Edith S. Jackmon
*Attorney, Agent, or Firm*—Bernard & Brown

[57] ABSTRACT

A quartz oscillation circuit used for a time standard of an electronic timepiece, which includes an inverter operating as an amplifier, an input capacitor and an output capacitor, the capacitors having the opposite temperature characteristics to compensate changes in oscillation frequency with the variation of temperature without any increase of the power consumption.

6 Claims, 16 Drawing Figures

QUARTZ OSCILLATION CIRCUIT FOR ELECTRONIC TIMEPIECES

BACKGROUND OF THE INVENTION

This invention relates to a quartz oscillation circuit for use in electronic timepieces as a source of a time standard.

A quartz oscillation circuit, which has generally been used as a time standard for electronic timepieces, is capable of maintaining an oscillation frequency with a high precision under given conditions but tends to oscillate at varying frequencies depending upon changes in the ambient temperature. In order to improve the temperature characteristics, it is accepted practice to employ elements having specific temperature characteristics, such as capacitors which constitute the oscillation circuit such that the change in frequency of the oscillator caused by the variation in temperature is compensated by the temperature characteristics of the elements. The above temperature-compensation system, however, causes the oscillation circuit to consume increased electric power as well as requires an increased voltage for maintaining the oscillation.

SUMMARY OF THE INVENTION

It is an object of this invention to provide a quartz oscillation circuit for electronic timepiece which has an improved oscillation frequency characteristic over a wide temperature range.

Another object of this invention is to provide a quartz oscillation circuit for timepieces with a desirable temperature-power consumption characteristic.

The quartz oscillation circuit according to this invention comprises an inverter and input and output capacitors which have different temperature-capacitance characteristics from each other.

DETAILED DESCRIPTION OF THE PREFERRED EMBODIMENTS

Figure 1:
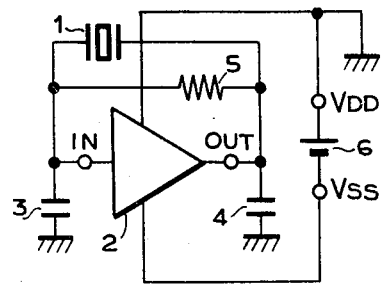
FIG. 1 is a circuit diagram of a quartz oscillation circuit embodying this invention.

In FIG. 1 is shown a circuitry of a quartz oscillation circuit of this invention, in which a quartz oscillator element 1 is connected between an input terminal IN and an output terminal OUT of an inverter 2 which operates as an amplifier. An input capacitor 3 is connected between the input terminal IN and the ground and the output terminal OUT is also connected to the ground through an output capacitor 4. Reference numeral 5 depicts a biasing resistor connected in parallel to the quartz oscillator element. Between power supply terminals $V_{DD}$ and $V_{SS}$ is connected an electric battery 6, the terminal $V_{DD}$ being grounded. In the quartz oscillation circuit of this invention the input and output capacitors have temperature-compensating characteristics.

Figure 2A:
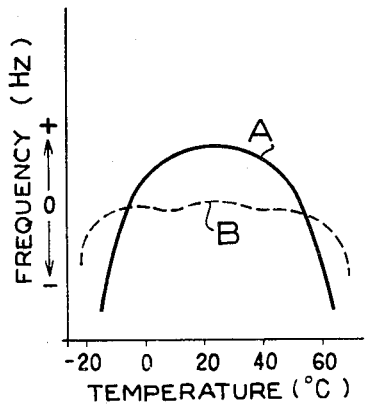
FIG. 2a is a graph showing a temperature-frequency characteristic of a conventional quartz oscillation circuit.
Figure 3A:
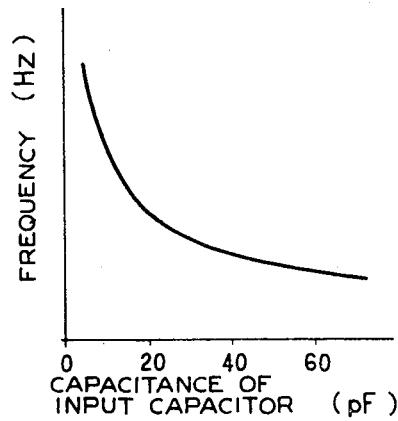
FIGS. 3a and 3b are graphs showing variation in the oscillation frequency with the capacitance of the input and output capacitors.
Figure 3B:
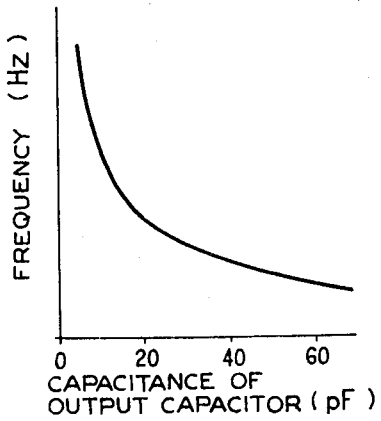

Assuming that the capacitors 3 and 4 do not have any temperature-compensating characteristics, the oscillating frequency of the circuit of FIG. 1 would be changed with the ambient temperature along a curve A of the second order as shown in FIG. 2a. Also, changes in oscillation frequency with changes in the input and output capacitors 3 and 4 exhibit negative characteristics as shown in FIGS. 3a and 3b. Thus, a timepiece including such quartz oscillation circuit will go slow at a temperature other than 20° C.

Figure 2B:
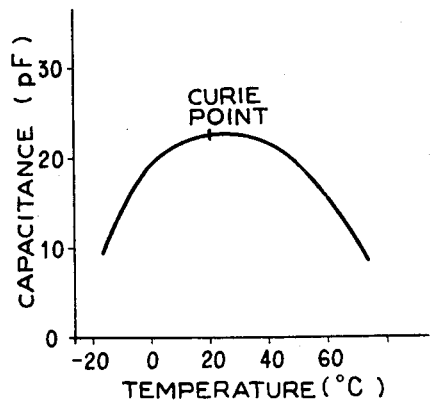
FIG. 2b shows a temperature-capacitance characteristic of a temperature compensating capacitor of the conventional oscillation circuit.

Therefore, according to the conventional temperature-compensating system, a temperature-compensating capacitor having a Curie point at about 20° C. and having characteristics of nearly a curve of the second order as shown by a temperature-capacitance characteristics diagram of FIG. 2b, is used as the input or output capacitor, in order to improve the temperature-frequency characteristics as represented by a curve B of FIG. 2a.

Figure 4A:
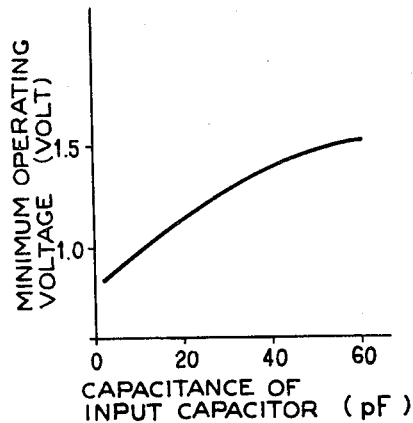
FIGS. 4a and 4b show the relationship between the minimum operating voltage and the capacitance of the input capacitor and the consumed current and the capacitance, respectively, when a temperature compensating capacitor is used as the input capacitor.
Figure 4B:
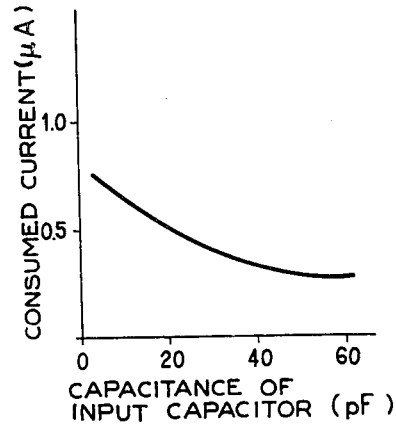

With such a quartz oscillation circuit, however, there exists such a relation between the input capacitor 3 and a minimum operation voltage $V_{en}$ for maintaining the oscillating operation that the minimum operating voltage tends to be increased with the capacitance of the input capacitor 3 as shown by FIG. 4a, and there further exists such a relation between the capacitor 3 and the consumed electric current $I_{DD}$ that the $I_{DD}$ is decreased with the capacitance of the capacitor 3 as shown by FIG. 4b.

Figure 5A:
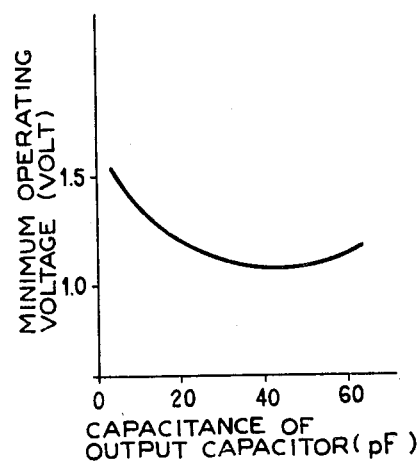
FIGS. 5a and 5b show the relationship between the minimum operating voltage and the capacitance of the output capacitor and between the consumed current and the capacitance, respectively, when a temperature compensating capacitor is used as the output capacitor.
Figure 5B:
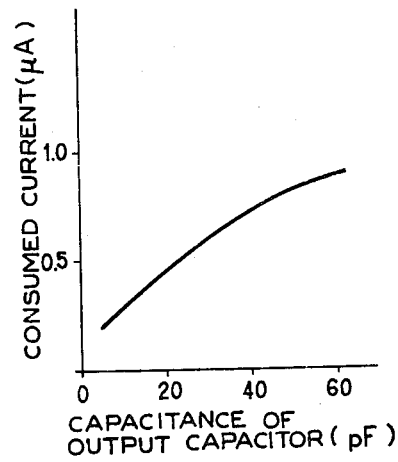

Furthermore, as shown in FIG. 5a, the relation between the capacitance of the output capacitor 4 and the $V_{en}$ is such that the $V_{en}$ decreases with the increase of the capacitance of the capacitor 4, and the relation between the capacitor 4 and the $I_{DD}$ is such that the $I_{DD}$ increases with the capacitance of the capacitor 4 as shown in FIG. 5b. Consequently, when a conventional temperature compensating capacitor having temperature-capacity characteristics shown in FIG. 2b is used as the input capacitor 3 of the quartz oscillation circuit, the $V_{en}$ can be improved at a low-temperature region but causing the $I_{DD}$ to be greatly increased in a high-temperature region. Further, when the temperature compensating capacitor is used as the output capacitor 4, the $I_{DD}$ characteristic can be improved in high-temperature regions, but the $V_{en}$ will be degraded in a low-temperature region, causing the oscillation to be ceased.

Figure 6A:
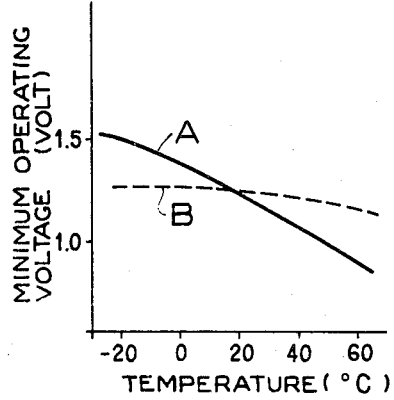
FIGS. 6a and 6b show changes in the minimum operating voltage and consumed current against temperature, respectively.
Figure 6B:
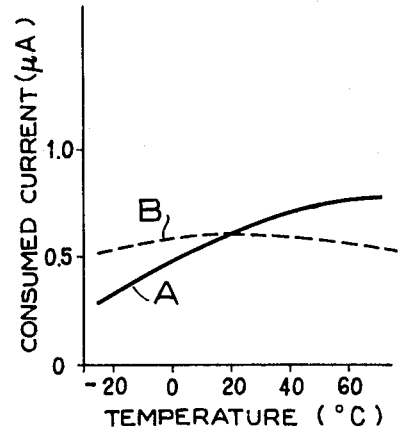

In regard to the temperature characteristics of the oscillator circuit, the $V_{en}$ characteristic tends to be degraded in a low-temperature region as represented by a curve A of FIG. 6a, and the $I_{DD}$ tends to be increased in a high-temperature region as represented by a curve A of FIG. 6b. Accordingly, if a conventional temperature-compensating capacitor is employed for the oscillator circuit, the $V_{en}$ characteristic tends to be further degraded in a low-temperature region, and the $I_{DD}$ characteristic tends to be further increased in a high-temperature region.

Figure 7A:
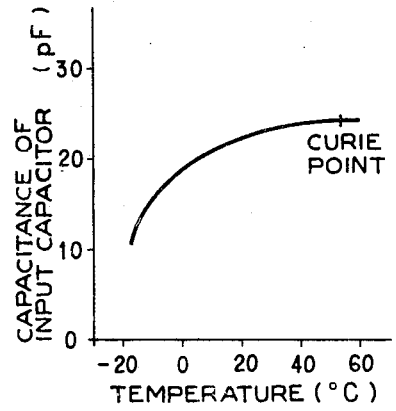
FIGS. 7a and 7b show the variation in the capacitance of the input capacitor against temperature and the variation in capacitance of the output capacitor against temperature, respectively, the capacitors being used in the oscillation circuit of this invention.
Figure 7B:
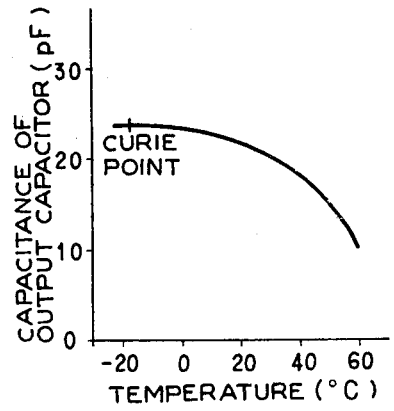

According to the quartz oscillation circuit of this invention, on the other hand, the input capacitor 3 has a temperature-compensating capacitor having such temperature-capacitance characteristics as shown in FIG. 7a with a Curie point on the high-temperature side and with a small secondary constant as compared with that of the conventional temperature-compensating capacitors, and the output capacitor 4 has a temperature-compensating capacitor having such temperature-capacitance characteristics as shown in FIG. 7b with a Curie point on the low-temperature side and with a small secondary constant as compared with that of the conventional temperature-compensating capacitors. Thus, within the temperature range that timepieces are normally utilized, i.e., from $-20°$ C. to $60°$ C., the input capacitor 3 has substantially positive temperature characteristics, while the output capacitor 4 has substantially negative temperature characteristics.

With the oscillator circuit including the temperature-compensating capacitors 3 and 4, the capacitance of the capacitor 4 will not be changed in a low-temperature region while the capacitance of the capacitor 3 only is decreased. Therefore, the oscillating frequency in the low-temperature region is compensated by the variation of the capacitance of the capacitor 3.

Likewise, the capacitance of the capacitor 3 will not be changed in a high-temperature region, while the capacitance of the capacitor 4 only is decreased. Therefore, the oscillating frequency in the high-temperature region is compensated by the variation of the capacitance of the capacitor 4. As a result, the frequencies are compensated by the means of the capacitors 3 and 4 as represented by the curve B of FIG. 2a.

Furthermore, with the oscillator circuit of this invention, the capacitance of the capacitor 4 will not be changed in the low-temperature regions but the capacitance of the capacitor 3 is decreased. Consequently, the $V_{en}$ tends to be decreased with the capacitance of the capacitor 3, accompanying the lowering of temperature as shown in FIG. 4a. As a result, the temperature characteristics of $V_{en}$ are improved as shown by the curve B of FIG. 6a. In the high-temperature regions, on the other hand, the capacitance of the capacitor 3 will not be changed but the capacitance of the capacitor 4 is decreased. Therefore, the $I_{DD}$ tends to be decreased with the decrease in the capacitance of the capacitor 4 as the temperature is raised as shown in FIG. 5b. As a result, the temperature characteristics of $I_{DD}$ are improved as indicated by the curve B of FIG. 6b.

Figure 8:
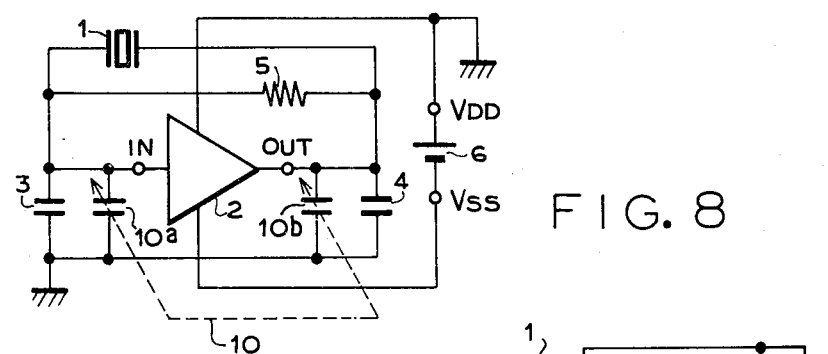
FIGS. 8 and 9 are modified embodiments of a quartz oscillation circuit according to this invention.

The quartz oscillation circuit of this invention may include, as shown in FIG. 8, a trimmer capacitor 10 comprising a pair of variable capacitors 10a and 10b which are connected in parallel with the input and output capacitors 3 and 4, respectively, in order to make it possible to adjust the osciallation frequency. Alternatively, as shown in FIG. 9, both the variable capacitors 10a, 10b can be connected in series with the input and output capacitors.

Figure 9:
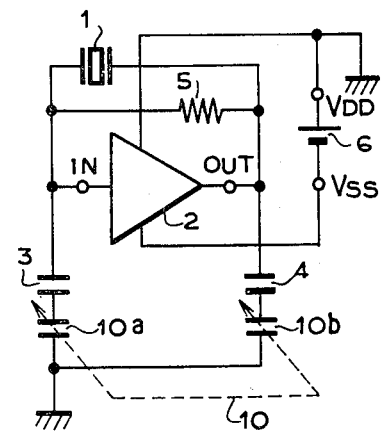

In the embodiments shown in FIGS. 8 and 9, the variable capacitors 10a, 10b act to balance the temperature-compensating characteristics at the input and output sides of the inverter 2 with narrow variable capacitance ranges. The quartz oscillation circuit can be utilized to form a time reference signal generating circuit with a conventional frequency divider circuit connected thereto.

Figure 10:
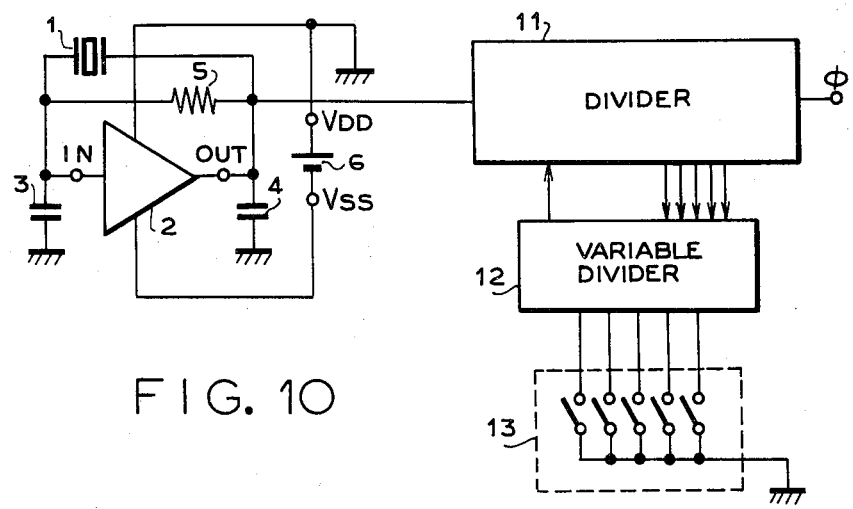
FIG. 10 is a suitable application of this invention in which the quartz oscillation circuit of FIG. 1 is connected to a frequency divider for functioning as a time reference signal generating circuit.

In FIG. 10 is shown a suitable form of time reference signal generating circuit having the quartz oscillation circuit shown in FIG. 1. The oscillating signal at the terminal OUT is delivered to a frequency divider circuit 11 to produce a time reference signal $\phi$. To the selected dividing stages of the divider circuit 11 is connected a variable divider circuit 12 which controls the dividing ratio of the dividing circuit 10 in accordance with the setting of a switch block 13.

In the time reference signal generating circuit of FIG. 10, the output signal of the quartz oscillation circuit, of which frequency is substantially irrespective to the changes in the ambient temperature, is supplied to the frequency divider where the frequency of the output signal is divided under control of the circuit 12, thereby to produce the time reference signal $\phi$ having an adjusted accuracy. Accordingly, the adjustment of the frequency can be done with no influence to the temperature-compensating characteristics of the quartz oscillation circuit.

According to this invention, as mentioned in the foregoing, the output frequency of the quartz oscillation circuit is separately compensated in a low-temperature region and in a high-temperature region, and whereby the minimum operating voltage can be lowered in the low-temperature region and, further, the power consumption can be reduced in the high-temperature region. Therefore, even when the circuit is so designed as to consume small power at a normal temperature, there is no probability that the oscillation is stopped. Besides, since the power consumption does not increase in the high-temperature region, the frequency is less varied with the temperature. Thus, according to this invention, it is possible to provide a quartz oscillation circuit which consumes less electric power.

Furthermore, when the variable frequency divider circuit is used, the fast-slow adjustment can be performed independently of the temperature compensation. In case that the fast-slow adjustment is done by adjusting variable capacitors, the mutual influence may be maintained at a low level. Thus, when the quartz oscillation circuit of this invention is applied to an electronic timepiece, the timepiece would be of high precision and enable the life of the battery to be lengthened.

What is claimed is:

1. A quartz oscillation circuit for electronic timepiece comprising an inverter for operating as an amplifier, an input capacitor connected to the input of the inverter and an output capacitor connected to the output of the inverter, one of the capacitors having substantially positive temperature characteristics and the other capacitor having substantially negative temperature characteristics within a temperature range of from $-20°$ C. to $60°$ C. that the timepiece is generally used.

2. The quartz oscillation circuit as defined in claim 1 wherein the input capacitor has positive temperature characteristics and wherein the output capacitor has negative temperature characteristics.

3. The quartz oscillation circuit as defined in claim 1 wherein a first variable capacitor is connected in parallel with the input capacitor and a second variable capacitor is connected in parallel with the output capacitor.

4. The quartz oscillation circuit as defined in claim 1 wherein a first variable capacitor is connected in series with the input capacitor and a second variable capacitor is connected in series with the output capacitor.

5. A quartz oscillation circuit for electronic timepiece comprising an inverter having an input terminal and an output terminal, a quartz oscillator element connected between the input and output terminals, a biasing resistor connected in parallel to the quartz oscillator element, a power supply source, a first capacitor connected between the input terminal of the inverter and one of the terminals of the source and a second capacitor connected between the output terminal and one of the terminals of the source, the first and second capacitors have the opposite temperature characteristics to each other within a temperature range of from −20° C. to 60° C. that the timepiece is generally used.

6. An electronic timepiece including
(a) a quartz oscillation circuit comprising an inverter for operating as an amplifier, an input capacitor connected to the input of the inverter and an output capacitor connected to the output of the inverter, one of the capacitors having substantially positive temperature characteristics and the other capacitor having substantially negative temperature characteristics within a temperature range of from −20° C. to 60° C. that the timepiece is generally used, and
(b) a variable divider circuit connected to the output of the quartz oscillation circuit to produce a time unit signal having an adjusted frequency.

* * * * *